(12) United States Patent
Yamate

(10) Patent No.: US 7,684,174 B2
(45) Date of Patent: Mar. 23, 2010

(54) THIN DISPLAY DEVICE AND PLASMA DISPLAY

(75) Inventor: Kazunori Yamate, Ibaraki (JP)

(73) Assignee: Panasonic Corporation, Osaka (JP)

( * ) Notice: Subject to any disclaimer, the term of this patent is extended or adjusted under 35 U.S.C. 154(b) by 1197 days.

(21) Appl. No.: 10/552,581

(22) PCT Filed: Apr. 15, 2004

(86) PCT No.: PCT/JP2004/005415

§ 371 (c)(1), (2), (4) Date: Oct. 12, 2005

(87) PCT Pub. No.: WO2004/093036

PCT Pub. Date: Oct. 28, 2004

(65) Prior Publication Data

US 2006/0197718 A1  Sep. 7, 2006

(30) Foreign Application Priority Data

Apr. 17, 2003 (JP) .............................. 2003-112355

(51) Int. Cl.
H05K 7/02 (2006.01)
H05K 7/00 (2006.01)
H05K 5/00 (2006.01)

(52) U.S. Cl. .......................... 361/679.01; 361/679.02; 361/679.21; 361/679.4

(58) Field of Classification Search ................ 345/905; 361/679.01, 679.21, 679.26, 679.27, 679.28, 361/679.4
See application file for complete search history.

(56) References Cited

U.S. PATENT DOCUMENTS 5,583,529 A * 12/1996 Satou .......................... 345/87
6,494,429 B2 * 12/2002 Tajima ....................... 248/473

(Continued)

FOREIGN PATENT DOCUMENTS

EP    0 200 513    11/1986

(Continued)

OTHER PUBLICATIONS

Japanese Office Action issued Mar. 11, 2008 in Japanese Patent Application No. 2005-505455 (along with English translation).

(Continued)

Primary Examiner—My-Chau T Tran
(74) Attorney, Agent, or Firm—Wenderoth, Lind & Ponack, L.L.P.

(57) ABSTRACT

A flat-panel display unit is provided which includes: a PDP; an aluminum chassis that is attached to the PDP; an upper data driver substrate and a signal processing substrate that are attached to the aluminum chassis; and a flexible cable that connects the substrates electrically. Between the substrates, a pressing plate fixes at least one part of the flexible cable, so that the space between the flexible cable and the aluminum chassis remains unchanged. Thereby, a stray capacitor can be stably formed using the insulating material of the flexible cable, and a high-frequency noise can be effectively reduced.

18 Claims, 7 Drawing Sheets

U.S. PATENT DOCUMENTS

| | | | |
|---|---|---|---|
| 6,636,000 B2 * | 10/2003 | Asami et al. | 315/169.3 |
| 6,657,620 B2 * | 12/2003 | Oishi et al. | 345/204 |
| 6,847,415 B1 * | 1/2005 | Yoshimura et al. | 349/58 |
| 7,091,665 B2 * | 8/2006 | Nomoto et al. | 313/583 |
| 7,120,010 B2 * | 10/2006 | Tajima | 361/679.21 |
| 7,456,807 B2 * | 11/2008 | Mizuno et al. | 345/60 |
| 2001/0024198 A1 | 9/2001 | Oishi et al. | |
| 2003/0117053 A1 * | 6/2003 | Tajima | 313/292 |

FOREIGN PATENT DOCUMENTS

| | | |
|---|---|---|
| EP | 1 311 146 | 5/2003 |
| JP | 9-171354 | 6/1997 |
| JP | 9-297871 | 11/1997 |
| JP | 2000-112392 | 4/2000 |
| JP | 2000-269582 | 9/2000 |
| JP | 2001-265245 | 9/2001 |
| JP | 2002-117726 | 4/2002 |
| JP | 2002-202730 | 7/2002 |
| JP | 2002-244568 | 8/2002 |
| JP | 2003-60325 | 2/2003 |

OTHER PUBLICATIONS

Supplementary European Search Report issued Jul. 23, 2008 in connection with EP 04 72 7734 corresponding to the present U.S. application.

* cited by examiner

CONVENTIONAL EXAMPLE
(OR PRIOR ART)

FIRST EMBODIMENT'S EXAMPLE

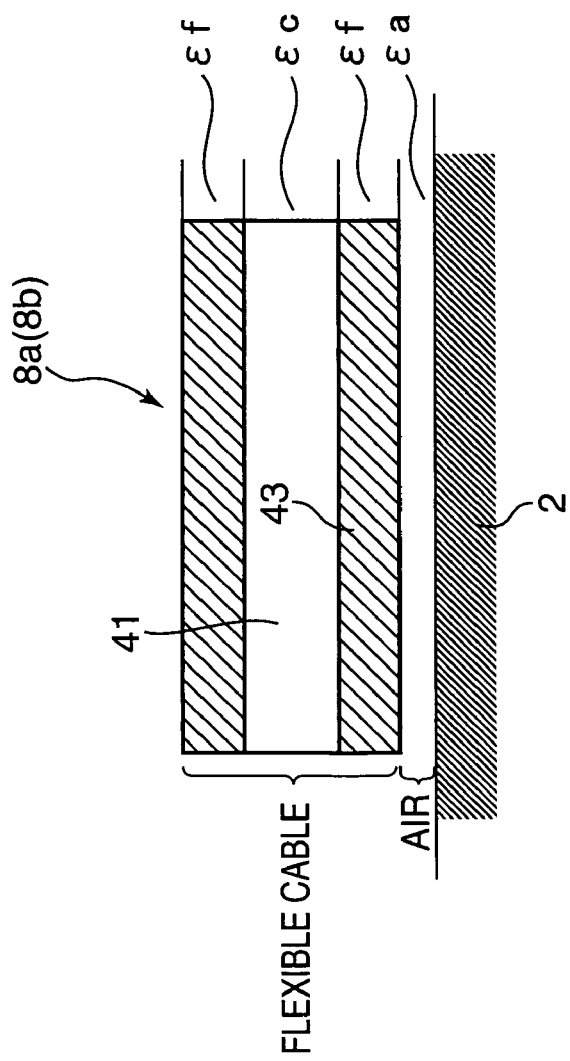
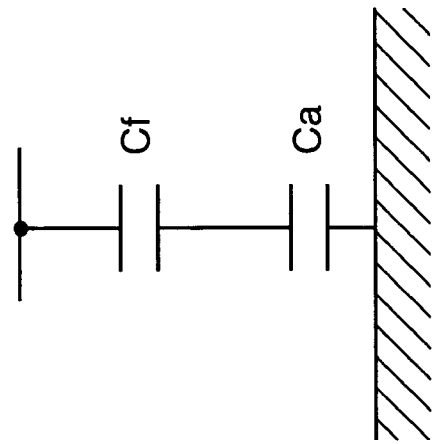

THIS WORKS AS A SPRING

THIN DISPLAY DEVICE AND PLASMA DISPLAY

BACKGROUND OF THE INVENTION

1. Field of the Invention

The present invention relates to a flat-panel display unit, such as a plasma display or a liquid-crystal display.

2. Description of the Related Art

Inside of the frame body of electronic equipment, a signal-transmission cable is used to transmit a signal between circuit substrates. In recent years, a thin sheet-type flexible cable (which is generally called an FFC (or flexible flat cable) or an FPC (or flexible printed circuit)) has become more popular as electronic equipment becomes smaller and denser. In such a flexible cable, its connecter is smaller than that of any other conventional flat cable. Thereby, the area necessary for mounting a cable on a circuit substrate becomes smaller. Additionally, the flexible cable is thinner and more flexible resulting in a greater degree of freedom. For reasoning in addition to those discussed above, the thin sheet-type flexible cable has been used.

The problem of electromagnetic wave noise apparent as a signal is transmitted faster (i.e. with a higher frequency). Electro-magnetic wave noise is radiated from a cable transmitting a signal between circuit substrates inside of electronic equipment. In order to restrain the emission of such an electro-magnetic wave noise, for example, Japanese Patent Laid-Open No. 2002-117726 specification discloses a case where a thin sheet-type flexible cable is subjected to shielding. FIG. 8 schematically shows the configuration of a shielded flexible cable 108.

In this flexible cable 108, a sheet-shaped shield conductor 102 and a sheet-shaped insulator 101 are formed in layers. The entire stratified body is covered with an insulating coat 107. Inside of the insulator 101, several conductive wires are provided in parallel. These conductive wires are a high-speed signal line 103 such as a clock signal line, a low-speed signal line 106 such as a ground line 104, a shield ground line (or a shield drain line) 105, a control signal line, and the like. The shield ground line 105 is used to connect the shield conductor 102 to the ground of a circuit substrate to which the flexible cable is connected. The shield ground line is connected to the shield conductor 102. The ground line 104 is not connected to the shield conductor 102 and is separate. In this flexible cable 108, the high-speed signal line 103 and the shield ground line 105 are adjacently disposed for the purpose of shielding. In addition to those lines, a power-source line and other signal lines are provided in the flexible cable 108. However, in the figure, they are omitted, and thus, only conductive, wires which are related to the following conventional disadvantages, are shown.

In the above described flexible cable 108 which is subjected to shielding, the shield conductor 102 and the shield ground line 105 contribute to reducing electro-magnetic wave noise. However, because the cable requires a multi-layer structure, it becomes an extremely expensive flexible cable. Additionally, as shown in FIG. 4A, if a flexible cable 11 connects substrates, some play is given. Therefore, as shown in FIG. 4A, the flexible cable 11 is disposed so as to bulge out.

However, if a flexible cable is used, for example, to connect substrates which are attached to an aluminum chassis 2 inside of a plasma display, then the aluminum chassis 2 is connected to a drive-system ground, a signal-system ground and a frame body. This generates a stray capacitance between the flexible cable 11 and the aluminum chassis 2. Therefore, when the flexible cable 11 is connected with such play, some dispersion can be produced in the bulge shown in FIG. 4A, thus dispersing the stray capacitance. In addition, a flexible cable is flexible and its shape is easily changed. Hence, as the shape is changed, the stray capacitance is also changed. In this case, the more largely the flexible cable 11 bulges out from the aluminum chassis 2, the lower the stray capacitance, resulting in the higher-harmonic component of a signal inside of the flexible cable 11 being difficult to drain to a ground. This prompts a high-frequency component to radiate from the flexible cable 11.

BRIEF SUMMARY OF THE INVENTION

In view of the above described conventional disadvantages, it is an object of the present invention to provide a flat-panel display unit which is capable of effectively restraining electro-magnetic wave noise which is generated by a cable, such as a flexible cable, using a simple and inexpensive configuration.

In order to attain the above described object, a flat-panel display unit according to the present invention, comprising a display panel, a conductive chassis attached to the display panel, a plurality of substrates attached to the conductive chassis, and a cable electrically connecting the substrates, wherein a fixing member is provided which fixes at least a part of the cable between the substrates.

In the flat-panel display unit, a stray capacitance is formed, using an insulating material of a cable, between a signal line inside of the cable and the conductive chassis. Using the fixing member, the cable is fixed between substrates, thus keeping such a stray capacitance from dispersing. This evades a situation in which the stray capacitance becomes small so that a higher-harmonic component cannot be drained to a ground. Hence, a stray capacitor is stably formed using the cable's insulating material, thereby effectively reducing high-frequency noise.

Furthermore, a flat-panel display unit according to the present invention, comprising a display panel, a conductive chassis attached to the display panel, a substrate attached to the conductive chassis, and a cable electrically connecting the display panel and the substrate, wherein a fixing member can also be provided which fixes at least a part of the cable between the display panel and the substrate.

Herein, if the fixing member is formed by a plate-shaped member which holds the cable so that the cable is sandwiched between it and the conductive chassis, most of the cable can be placed along the conductive chassis. This increases a stray capacitance. As a result, via the stray capacitance, a high-frequency component can flow adequately, using the conductive chassis. Therefore, high-frequency noise can be more effectively reduced. Further, the plate-shaped member is designed to be only placed on the cable. Hence, using an extremely simple configuration, a high-frequency noise can be effectively reduced. In addition, the cable is sandwiched using the plate-shaped member, so that no bulge is required. This helps to narrow a wiring space, and thus, thin such a display unit.

Moreover, if the plate-shaped member is formed by a metal plate, the cable is sandwiched between both surfaces of metal, thereby doubling a stray capacitance. Additionally, this metal plate's shielding function contributes to further restraining high-frequency noise from being emitted.

In addition, if the metal plate is connected by means of a conductive connecting member to the conductive chassis, high-frequency noise can be drained to the ground via this connecting member. This helps efficiently restrain high-frequency noise from radiating.

In addition, the cable can be formed by a flexible cable. Herein, the flexible cable is flexible and its shape is easily changed, but it is fixed on the fixing member. Thereby, even if it bears an external force after being attached to the substrate, its shape cannot be easily changed. Therefore, even if the flexible cable is used, a stray capacitance can be kept constant.

If the flexible cable is formed as a single-layer structure which includes only an insulating layer where a signal line is disposed, then high-frequency noise can be kept from radiating and costs can be lowered.

It is preferable that the conductive chassis be made of aluminum.

Furthermore, a plasma display according to the present invention, comprising a plasma display panel (hereinafter, referred to as the "PDP"), a conductive chassis attached to the PDP, a plurality of substrates attached to the conductive chassis, and a flexible cable electrically connecting the substrates, wherein a fixing member may also be provided which fixes at least a part of the flexible cable between the substrates.

Moreover, a plasma display according to the present invention, comprising a PDP, a conductive chassis attached to the PDP, a substrate attached to the conductive chassis, and a flexible cable electrically connecting the PDP and the substrate, wherein a fixing member may also be provided which fixes at least a part of the flexible cable between the PDP and the substrate.

BRIEF DESCRIPTION OF THE DRAWINGS

FIG. 4A corresponds to FIG. 1B in the conventional example. FIG. 4B corresponds to FIG. 1B in the first embodiment.

FIG. 5A is an illustration, showing a stray capacitance which is formed between a flexible cable and an aluminum chassis.

FIG. 5B is an illustration, showing its equivalent circuit.

DETAILED DESCRIPTION OF THE INVENTION

Best modes for implementing the present invention will be described with reference to drawings.

First Embodiment

Figures 1A, 1B:
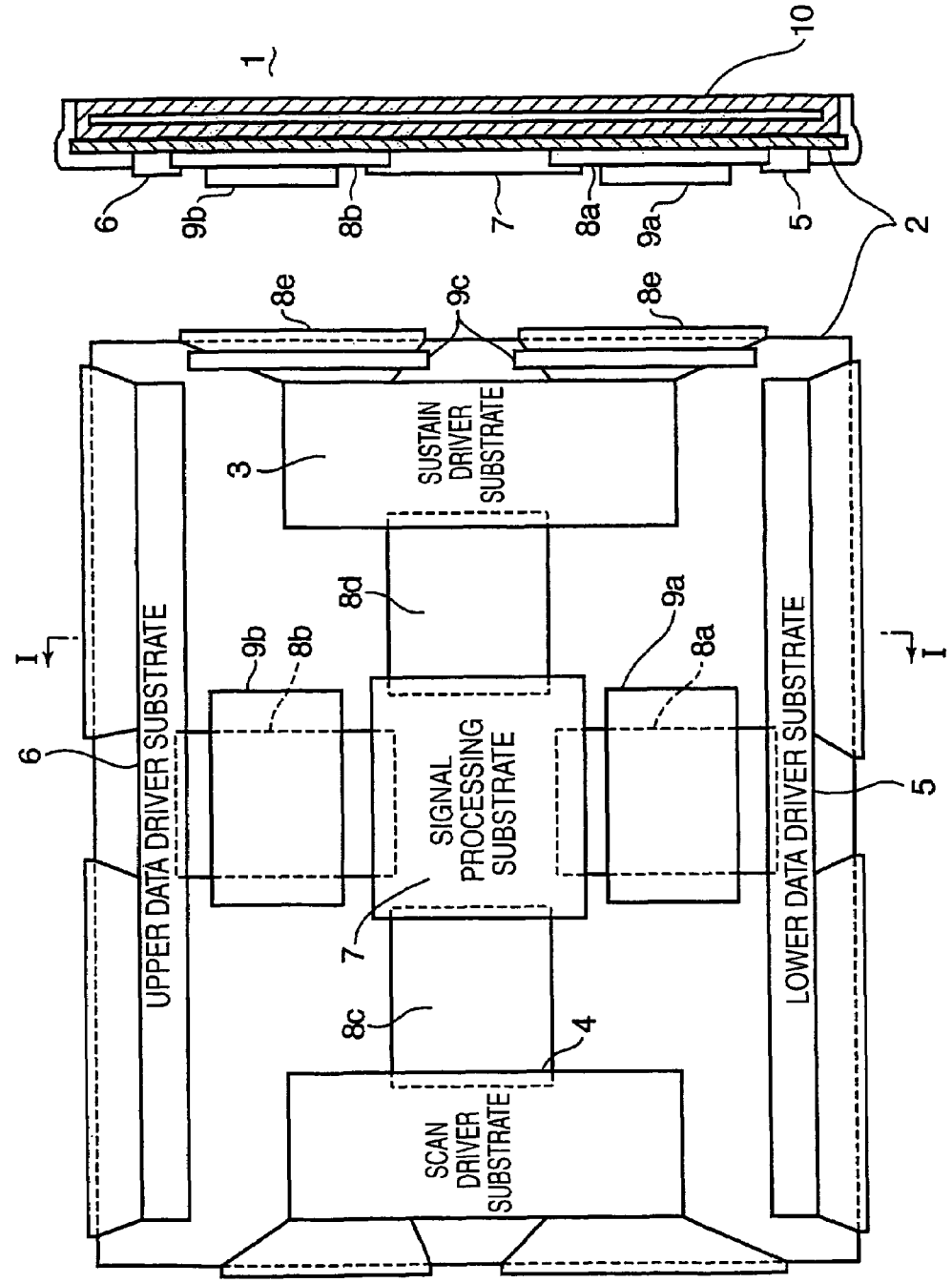
FIG. 1A is a rear view of a plasma display according to a first embodiment of the present invention, showing its external appearance.
FIG. 1B is a sectional view of the plasma display, seen along a I-I line of FIG. 1A.

As shown in FIGS. 1A and 1B, in a plasma display 1 according to a first embodiment of the present invention, an aluminum chassis 2 is attached to the rear side of a PDP 10. This aluminum chassis 2 is formed by an aluminum die-casting. To this aluminum chassis 2, a plurality of substrates are each attached at a predetermined position, such as a sustain driver substrate 3, a scan driver substrate 4, a lower data driver substrate 5, an upper data driver substrate 6 and a signal processing substrate 7. The signal processing substrate 7 is located substantially in the middle of the aluminum chassis 2. Below this signal processing substrate 7, the lower data driver substrate 5 is placed, and the upper data driver substrate 6 is located above it. In FIG. 1A, the sustain driver substrate 3 and the scan driver substrate 4 are disposed on the right side and the left side of the signal processing substrate 7, respectively.

The above described substrates 3, 4, . . . are connected electrically. For example, as shown in FIG. 1A, the lower data driver substrate 5 and the signal processing substrate 7 are electrically connected via a flexible cable 8a. The upper data driver substrate 6 and the signal processing substrate 7 are electrically connected via a flexible cable 8b. Similarly, the scan driver substrate 4 and the signal processing substrate 7 are electrically connected via a flexible cable 8c. The sustain driver substrate 3 and the signal processing substrate 7 are electrically connected via a flexible cable 8d. The signal processing substrate 7 lies exactly in the middle between the lower data driver substrate 5 and the upper data driver substrate 6. In short, the flexible cable 8a and the flexible cable 8b have substantially the same length. This makes it easy to set timing.

Hereinafter, the flexible cable 8b will be described which is used to connect the upper data driver substrate 6 and the signal processing substrate 7. The other flexible cables which connect their predetermined substrates are similar, and thus, their description is omitted. Herein, a connecter is provided at both ends of the flexible cable 8b, though they are not shown, for convenience, in FIGS. 1A and 1B. Such a connecter is fitted to a connecter of each substrate 6, 7, so that the flexible cable 8b is connected to the substrate 6, 7.

Figure 2:
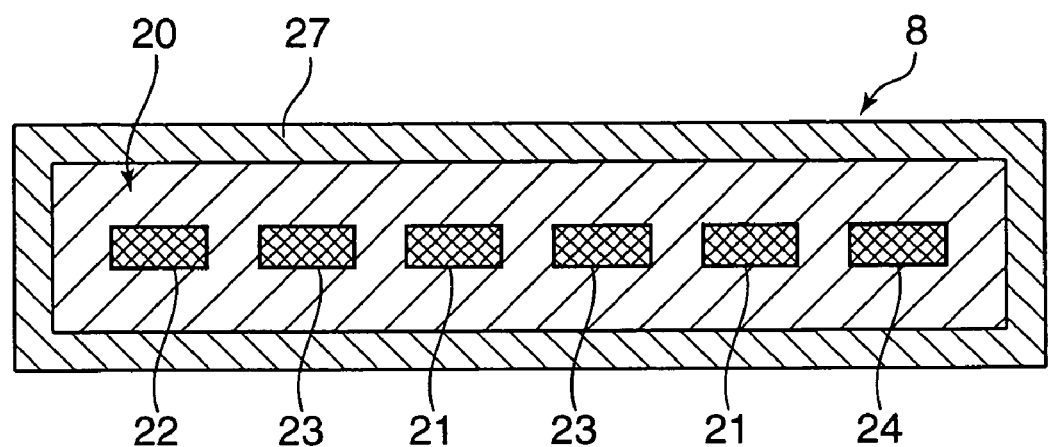
FIG. 2 is a sectional view of an example of a flexible cable which is used in the plasma display.
Figure 8:
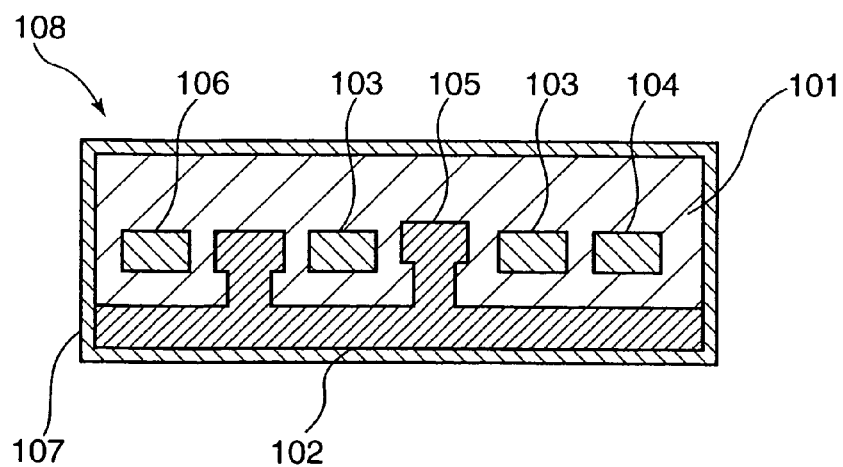
FIG. 8 is a sectional view of a shielded flexible cable.

The flexible cable 8b which connects the upper data driver substrate 6 and the signal processing substrate 7 is formed, for example, as shown in FIG. 2, as a single-layer structure which has no shield layer. Specifically, this flexible cable 8b includes a sheet-type insulator 20 in which several signal lines 21, 22, 23, 24 are disposed in the width directions of the flexible cable. It does not include such a shield conductor as shown in FIG. 8. In other words, the flexible cable 8b has no multi-layer structure. The insulator 20 is covered with an insulating coat 27. Herein, this insulating coat 27 may also be omitted. The above described signal lines are a high-speed signal line 21, a low-speed signal line 22, a shield ground line 23, a ground line 24 and the like. For convenience, the other signal lines are not shown in the figure. The flexible cable 8b sends a signal, for example, at a transfer rate of 50 to 60 mbps.

The flexible cables 8a, 8b are fixed at their predetermined parts between the connecters, as shown in FIGS. 1A and 1B, by pressing plates 9a, 9b, respectively. These pressing plates 9a, 9b are examples of a fixing member which fixes the flexible cable 8a, 8b on the aluminum chassis 2. In this first embodiment, the pressing plates 9a, 9b are formed by a metal plate. For example, the metal plate is made of rolled steel, stainless steel, aluminum, aluminum alloy, copper, copper alloy, or the like. Additionally, the material of the pressing plates 9a, 9b is not limited to metal, and thus, it may also be made of resin or another material.

Figure 3A:
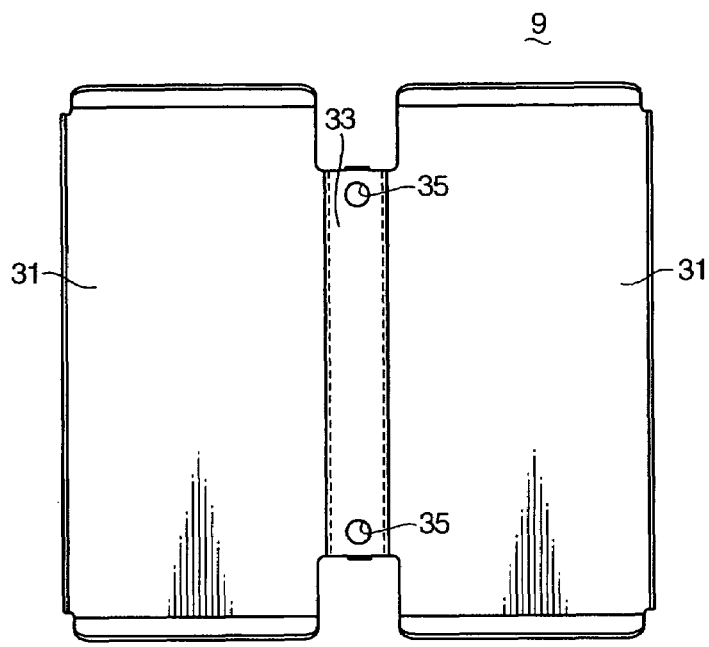
FIG. 3A is a front view of a pressing plate according to the first embodiment of the present invention.
Figure 3B:
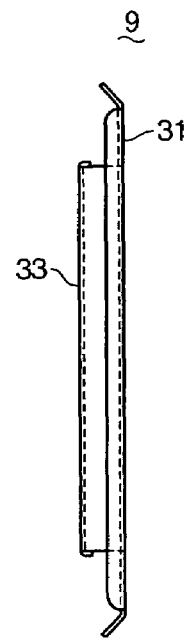
FIG. 3B is a side view of this pressing plate.
Figure 3C:
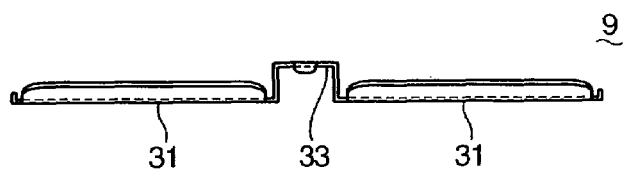
FIG. 3C is a bottom view of this pressing plate.

As shown in FIGS. 3A to 3C, the pressing plates 9a, 9b include a pair of pressing portions 31, 31 and a connection portion 33 which connects both pressing portions 31, 31. Each pressing portion 31, 31 is a part which presses and holds the flexible cables 8a, 8b on the aluminum chassis 2. Each pressing portion 31, 31 has a long rectangular flat-plate shape, and they have the same shape. Each pressing portion 31, 31 is placed to extend along the length directions of the flexible cables 8a, 8b.

The pressing plates 9a, 9b may also fix the two flexible cables 8a, 8b, using both pressing portions 31, 31. Or, a single flexible cable 8a, 8b may also be fixed, using one pressing portion 31.

In addition, they are not limited to a form in which the two flexible cables 8a, 8b can be fixed. A form where only a single flexible cable 8a, 8b is fixed may also be used.

The connection portion 33 is formed to connect one long side of each pressing portion 31, 31. In the other three sides of each pressing portion 31, 31, their ends are bent so that the flexible cables 8a, 8b will not be damaged.

As shown in FIG. 3C, the connection portion 33 is bent into a shape protruding from the pressing portions 31, 31. This shape enables each pressing portion 31, 31 to press down the flexible cables 8a, 8b, even though the connection portion 33 comes into contact with a boss (not shown) which is provided to protrude in the aluminum chassis 2. Besides, in the connection portion 33, two connection holes 35, 35 are formed. Into each connection hole 35, 35, a screw (not shown) is inserted, and then, it is fitted into the above described boss. Thereby, the pressing plates 9a, 9b can be fixed on the aluminum chassis 2. In other words, in this first embodiment, the two connection holes 35, 35 are formed in the connection portion 33. Thus, at two places in the length directions of the flexible cables 8a, 8b, the pressing plates 9a, 9b are designed to be fixed on the aluminum chassis 2. Herein, how to fix the pressing plates 9a, 9b is not limited to driving a screw. For example, they can also be fixed, using a connection by means of a rivet (not shown), staking, or the like.

The flexible cables 8a, 8b are sandwiched between the aluminum chassis 2 and the pressing plates 9a, 9b. As a whole, they are attached tightly to the aluminum chassis 2 and the pressing plates 9a, 9b. Herein, in this first embodiment, the aluminum chassis 2 is formed by die-casting, and thus, its surface is rough. This may leave some crevices between the aluminum chassis 2 and the flexible cables 8a, 8b. The width of such a crevice is thought to be approximately 1 to 2 mm at its place. There is a case where a protruding rib (not shown) is provided in the aluminum chassis 2 and the flexible cables 8a, 8b are disposed to stride over this rib. In that case, such a rib also gives space between the aluminum chassis 2 and the flexible cables 8a, 8b, and as a result, the space becomes 3 to 5 mm.

Figures 4A, 4B:
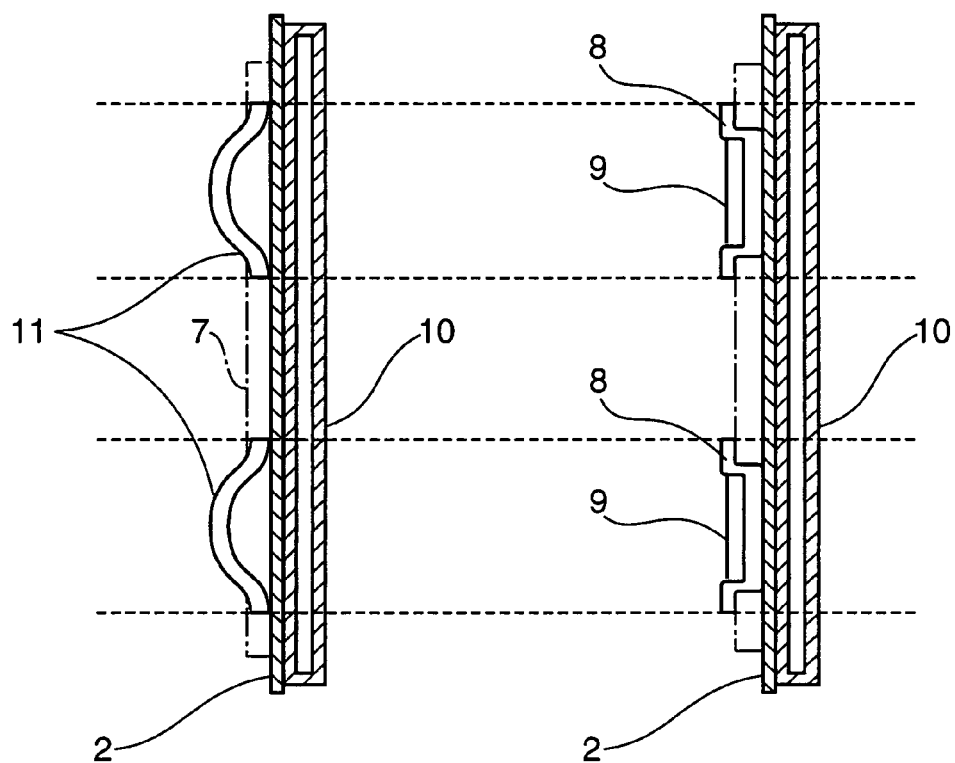
FIG. 4A and FIG. 4B are each a rear view of a plasma display, comparing a conventional example and the first embodiment of the present invention.

In this embodiment, as shown in FIG. 1 and FIG. 4B, the pressing plates 9a, 9b can attach the flexible cables 8a, 8b closely to the aluminum chassis 2. Hence, compared with the conventional example shown in FIG. 4A, a stray capacitance can be raised. Specifically, as shown in FIG. 5A, a signal line 41 which is formed by, for example, a copper wire in the flexible cable 8a(8b). A capacitance C between the signal line 41 and the aluminum chassis 2 can be expressed as a combined capacitance of a capacitance Ca of air and a capacitance Cf of an insulating layer 43 which is formed by the insulator 20 and the insulating coat 27. Herein, a relative dielectric constant $\in_a$ of air is 1 and a relative dielectric constant $\in_f$ of the insulating layer is 4.3 to 4.4. Taking this into account and an equivalent circuit shown in FIG. 5B, the combined capacitance C can be expressed by the following.

$$C = \frac{1}{\frac{1}{Ca} + \frac{1}{Cf}} = \frac{Cf \cdot Ca}{Cf + Ca} = \frac{Ca}{1 + \frac{Ca}{Cf}} \approx Ca \ (Cf \gg Ca)$$

Therefore, in order to make a stray capacitance greater, it is desirable that a crevice be made as narrow as possible. Preferably, the flexible cable 8a(8b) should be attached tight to the aluminum chassis 2. Herein, as described earlier, even if there are several spaces of about 1 to 5 mm between the aluminum chassis 2 and the pressing plate 9a(9b), a stray capacitance can be secured to such a degree that a higher-harmonic component could flow to a ground.

As described so far, in this first embodiment, the pressing plates 9a, 9b fix the flexible cables 8a, 8b, respectively, so that the distance between the flexible cables 8a, 8b and the aluminum chassis 2 will not be changed. This helps relatively keep a stray capacitance from dispersing. In other words, in the conventional example shown in FIG. 4A, the value of a stray capacitance depends upon how the cable bulges. In contrast, in this first embodiment, the flexible cables 8a, 8b are fixed by the pressing plates 9a, 9b, thereby stabilizing the value of a stray capacitance. Therefore, the stray capacitance is not easily reduced so that the higher-harmonic component is difficult to drain to ground. Hence, a stray capacitor is stably formed using the insulating material of the flexible cables 8a, 8b. This helps effectively reduce high-frequency noise.

Furthermore, the pressing plates 9a, 9b press the flexible cables 8a, 8b onto the aluminum chassis 2, so that the flexible cables 8a, 8b go along the aluminum chassis 2. This helps increase a stray capacitance. Therefore, via a stray capacitor, high-frequency component can be drained in larger quantities to the aluminum chassis 2 (i.e., ground). This helps reduce high-frequency noise more efficiently.

Moreover, most of the flexible cables 8a, 8b between the substrates 5, 6, 7 are sandwiched between the pressing plates 9a, 9b and the aluminum chassis 2. Therefore, in a great part across these substrates 5, 6, 7, the flexible cables 8a, 8b can be fixed so that the space between the flexible cables 8a, 8b and the aluminum chassis 2 remains unchanged. Consequently, the flexible cables 8a, 8b can be kept from changing the value of a stray capacitance. Herein, the range that the flexible cables 8a, 8b are pressed down may be properly decided, taking a voltage into account.

In this first embodiment, the flexible cables 8a, 8b are each used to electrically connect each data driver substrate 5, 6 and the signal processing substrate 7, 7 are fixed by the pressing plates 9a, 9b, respectively. However, it is not limited to this configuration in which the cables 8a, 8b are fixed. Specifically, in the plasma display 1, as described already, for example, a large number of substrates, such as the sustain driver substrate 3 and the scan driver substrate 4, are attached to the aluminum chassis 2. Hence, at least a part of the cables 8c, 8d which connect the substrates 3, 4, can be designed to be fixed by a pressing plate. Further, all cables can also be fixed by pressing plates.

In addition, the present invention is not limited to a configuration in which the cables 8a, 8b, . . . which connect the substrates 3, 4, . . . are fixed. For example, a cable which electrically connects the PDP 10 and a substrate can also be configured to be fixed at certain part by a pressing plate. For example, FIG. 1 illustrates a configuration in which a flexible cable 8e which electrically connects the PDP 10 and the sustain driver substrate 3 is fixed at a part between the PDP 10 and the sustain driver substrate 3 by a pressing plate 9c.

Second Embodiment

Figure 6A:
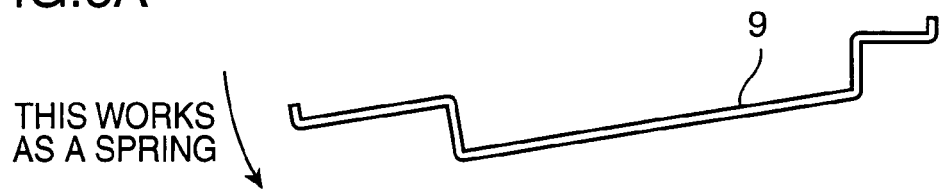
FIG. 6A is a sectional view of a pressing plate according to a second embodiment of the present invention.
Figure 6B:
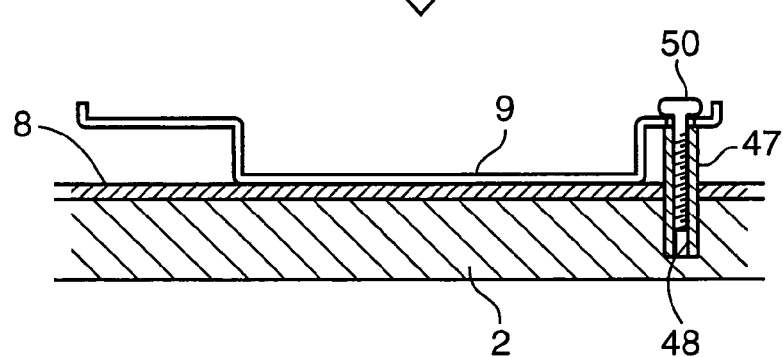
FIG. 6B is a sectional view of this pressing plate which is connected to an aluminum chassis.

In the above described first embodiment, the pressing plates 9a, 9b are connected to the flexible cables 8a, 8b, at two places in their length directions. However, in this second embodiment, as shown in FIGS. 6A and 6B, such a connection is made at one place in the length directions of a flexible cable 8. In this case, a pressing plate 9 may also be wider than the flexible cable 8, so that this pressing plate 9 can be connected to both sides of the flexible cable 8. As shown in the figure, a boss 47 with a screw hole 48 is pushed into the aluminum chassis 2. Then, a screw 50 for fixing the pressing plate 9 is fitted into this boss 47. Thereby, the pressing plate 9 is fixed on the aluminum chassis 2.

As shown in FIG. 6A, in the case of the pressing plate 9 works as a spring, using its biasing force, it can press the flexible cable 8 more effectively. This pressing plate 9 may also be a metal plate, as long as it functions as a leaf spring. Additionally, may also be a non-metallic plate which is made of resin or the like.

Hence, the configuration in which the flexible cable 8 is fixed at one place in its length directions is suitable for a case where the aluminum chassis 2 is formed by not a die casting but a press plate to have a smooth surface, or another such case.

If the aluminum chassis 2 has a smooth surface, the flexible cable 8 can be attached close to the surface of the aluminum chassis 2. Therefore, if the present invention is applied to an aluminum chassis 2 formed by a press plate, it is extremely effective.

Herein, the other configurations, operation and advantages are the same as those of the first embodiment.

Third Embodiment

Figure 7A:
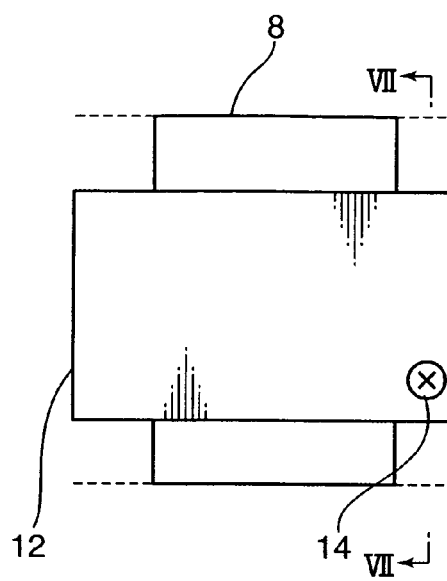
FIG. 7A is a sectional view of a pressing plate according to a third embodiment of the present invention which is connected to an aluminum chassis.
Figure 7B:
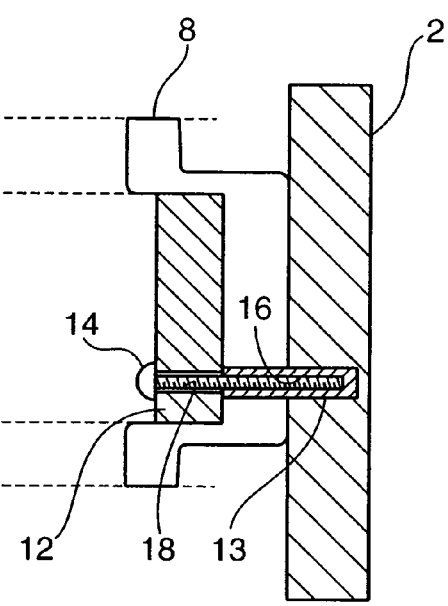
FIG. 7B is a sectional view of the pressing plate, seen along a VII-VII line of FIG. 7A.

A plasma display according to a third embodiment of the present invention will be described with reference to FIGS. 7A and 7B. In those figures, the aluminum chassis 2 and the flexible cable 8 are the same as those of the first embodiment. Herein, the parts which are different from those of the first embodiment are described. Hence, the same reference numerals are given to the same configurations as those of the first embodiment, and thus, their description is omitted.

In this third embodiment, a pressing plate 12 is electrically connected to the aluminum chassis 2. The pressing plate 12 is, for example, an aluminum plate. Additionally, a boss 13 with a screw hole 16 is buried into the aluminum chassis 2. Then, into the screw hole 16 of the boss 13, a conductive screw 14 is fitted which is inserted through a screw insertion hole 18 of the pressing plate 12. For example, a steel material can be used for the screw 14, the material being subjected to metallic plating (e.g., nickel plating) with low conductivity. Therefore, the screw 14 connects the pressing plate 12 and the boss 13, so that the pressing plate 12 can be electrically connected to the aluminum chassis 2.

As described above, the pressing plate 12 fixes the flexible cable 8 so that its shape could not be changed. In addition, this pressing plate 12 is formed by a metal plate. Hence, the flexible cable 8 is surrounded with this pressing plate 12 and the aluminum chassis 2. This helps double a stray capacitance and effectively restrain high-frequency noise from radiating. Additionally, the pressing plate 12 is electrically connected to the aluminum chassis 2. This means that both the aluminum chassis 2 and the pressing plate 12 are connected to a ground. As a result, via the pressing plate 12, high-frequency noise can be by-passed to ground.

Therefore, the flexible cable 8 is attached tightly to the aluminum chassis 2, so that high-frequency noise can be kept down. Furthermore, the metallic pressing plate 12 fixes the flexible cable 8, thus realizing a shielding effect, using an inexpensive configuration. Moreover, such an increase in stray capacitance contributes to reducing high-frequency noise further.

Herein, in this third embodiment, via the screw 14, the pressing plate 12 is electrically connected to the aluminum chassis 2. However, the present invention is not limited to the above. Thus, other configurations may also be used, as long as conductivity can be obtained between the pressing plate 12 and the aluminum chassis 2.

This application is based on Japanese patent application serial No. 2003-112355, filed in Japan Patent Office on Apr. 17, 2003, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

INDUSTRIAL APPLICABILITY

The present invention can be used for a flat-panel display unit with a conductive chassis, such as a plasma display and a liquid-crystal display.

The invention claimed is:

1. A flat-panel display unit comprising:
   a display panel;
   a conductive chassis attached to the display panel;
   a plurality of substrates attached to the conductive chassis;
   a cable electrically connecting the substrates; and
   a plate-shaped member which fixes at least a part of the cable connected between the substrates such that the cable is sandwiched between the plate-shaped member and the conductive chassis.

2. A flat-panel display unit comprising:
   a display panel;
   a conductive chassis attached to the display panel;
   a substrate attached to the conductive chassis;
   a cable electrically connecting the display panel and the substrate; and
   a plate-shaped member which fixes at least a part of the cable connected between the display panel and the substrate such that the cable is sandwiched between the plate-shaped member and the conductive chassis.

3. The flat-panel display unit according to claim 1, wherein the plate-shaped member is formed by a metal plate.

4. The flat-panel display unit according to claim 3, wherein the metal plate is connected to the conductive chassis by a conductive connecting member.

5. The flat-panel display unit according to claim 1, wherein the cable is formed by a flexible cable.

6. The flat-panel display unit according to claim 5, wherein the flexible cable is formed as a single-layer structure.

7. The flat-panel display unit according to claim 1, wherein the conductive chassis is made of aluminum.

8. A plasma display comprising:
   a plasma display panel;
   a conductive chassis attached to the plasma display panel;
   a plurality of substrates attached to the conductive chassis;
   a flexible cable electrically connecting the substrates; and
   a plate-shaped member which fixes at least a part of the flexible cable connected between the substrates such that the cable is sandwiched between the plate-shaped member and the conductive chassis.

9. A plasma display comprising:
   a plasma display panel;
   a conductive chassis attached to the plasma display panel;
   a substrate attached to the conductive chassis;
   a flexible cable electrically connecting the plasma display panel and the substrate; and
   a plate-shaped member which fixes at least a part of the flexible cable connected between the plasma display panel and the substrate such that the cable is sandwiched between the plate-shaped member and the conductive chassis.

10. The flat-panel display unit according to claim 2, wherein the plate-shaped member is formed by a metal plate.

11. The flat-panel display unit according to claim 10, wherein the metal plate is connected by means of a conductive connecting member to the conductive chassis.

12. The flat-panel display unit according to claim 2, wherein the cable is formed by a flexible cable.

13. The flat-panel display unit according to claim 12, wherein the flexible cable is formed as a single-layer structure.

14. The flat-panel display unit according to claim 2, wherein the conductive chassis is made of aluminum.

15. A flat-panel display unit comprising:
a display panel;
a conductive chassis attached to the display panel;
a plurality of substrates attached to the conductive chassis;
a cable electrically connecting the substrates; and
a plate-shaped member which fixes at least a part of the cable connected between the substrates such that at least the part of the cable connected between the substrates extends along the conductive chassis.

16. A flat-panel display unit comprising:
a display panel;
a conductive chassis attached to the display panel;
a substrate attached to the conductive chassis;
a cable electrically connecting the display panel and the substrate; and
a plate-shaped member which fixes at least a part of the cable connected between the display panel and the substrate such that at least the part of the cable connected between the display panel and the substrate extends along the conductive chassis.

17. A plasma display comprising:
a plasma display panel;
a conductive chassis attached to the plasma display panel;
a plurality of substrates attached to the conductive chassis;
a flexible cable electrically connecting the substrates; and
a plate-shaped member which fixes at least a part of the flexible cable connected between the substrates such that at least the part of the flexible cable connected between the substrates extends along the conductive chassis.

18. A plasma display comprising:
a plasma display panel;
a conductive chassis attached to the plasma display panel;
a substrate attached to the conductive chassis;
a flexible cable electrically connecting the plasma display panel and the substrate; and
a plate-shaped member which fixes at least a part of the flexible cable connected between the plasma display panel and the substrate such that at least the part of the flexible cable connected between the plasma display panel and the substrate extends along the conductive chassis.

* * * * *